US010482988B2

(12) United States Patent
Li

(10) Patent No.: US 10,482,988 B2
(45) Date of Patent: Nov. 19, 2019

(54) RECLAIMABLE SEMICONDUCTOR DEVICE PACKAGE AND ASSOCIATED SYSTEMS AND METHODS

(71) Applicant: Micron Technology, Inc., Boise, ID (US)

(72) Inventor: Yueping Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/815,521

(22) Filed: Nov. 16, 2017

(65) Prior Publication Data

US 2018/0090223 A1    Mar. 29, 2018

Related U.S. Application Data

(62) Division of application No. 14/760,615, filed as application No. PCT/CN2013/000031 on Jan. 15, 2013, now Pat. No. 9,875,808.

(51) Int. Cl.
*G11C 29/04* (2006.01)
*H01L 23/544* (2006.01)
(Continued)

(52) U.S. Cl.
CPC ............ *G11C 29/04* (2013.01); *G11C 5/04* (2013.01); *G11C 29/44* (2013.01); *H01L 22/22* (2013.01);
(Continued)

(58) Field of Classification Search
CPC ......... H01L 22/22; G11C 29/04; G11C 29/44; G11C 5/04
See application file for complete search history.

(56) References Cited

U.S. PATENT DOCUMENTS 7,636,274 B2   12/2009  Bhakta et al.
7,715,255 B2    5/2010  Tu et al.
(Continued)

FOREIGN PATENT DOCUMENTS

CN   101034387 A   9/2007
CN   102484099 A   5/2012
(Continued)

OTHER PUBLICATIONS

Office Action dated Aug. 31, 2015 in Taiwan Application No. 103101483, 6 pages.
(Continued)

*Primary Examiner* — Anthan Tran
(74) *Attorney, Agent, or Firm* — Perkins Coie LLP

(57) ABSTRACT

Several embodiments of reclaimable semiconductor device packages and assemblies are disclosed herein. A semiconductor device assembly (100) includes a package (101) having a housing (102) and a package contact (104) arranged to receive a signal indicative of a reclamation state. A plurality of modules of semiconductor dies (106) are located within the housing and electrically coupled to the package contact (104). The dies (106) of the first and second modules dies are configured to store a module configuration state. The first and second modules (107a, 107b) are enabled for operation based, at least in part, on the reclamation state and the module configuration state.

8 Claims, 6 Drawing Sheets

(51) Int. Cl.
*G11C 29/44* (2006.01)
*H01L 25/065* (2006.01)
*G11C 5/04* (2006.01)
*H01L 21/66* (2006.01)
*H01L 23/525* (2006.01)
*H01L 23/00* (2006.01)

(52) U.S. Cl.
CPC ........ *H01L 23/5256* (2013.01); *H01L 23/544* (2013.01); *H01L 25/0657* (2013.01); *G11C 2029/0401* (2013.01); *G11C 2029/4402* (2013.01); *H01L 22/14* (2013.01); *H01L 22/20* (2013.01); *H01L 24/98* (2013.01); *H01L 2223/5444* (2013.01); *H01L 2223/54473* (2013.01); *H01L 2224/16225* (2013.01); *H01L 2924/19107* (2013.01)

(56) References Cited

U.S. PATENT DOCUMENTS

| | | | |
|---|---|---|---|
| 7,757,037 | B2 | 7/2010 | Chen et al. |
| 7,779,311 | B2 | 8/2010 | Ong et al. |
| 7,796,461 | B2 | 9/2010 | Kawaguchi et al. |
| 7,965,575 | B2 | 6/2011 | Kajigaya et al. |
| 2007/0165461 | A1* | 7/2007 | Cornwell ............... G11C 29/88 365/185.33 |
| 2007/0230336 | A1 | 10/2007 | Hanai et al. |
| 2009/0065773 | A1 | 3/2009 | Ishikawa et al. |
| 2009/0325321 | A1 | 12/2009 | Ong et al. |
| 2010/0074038 | A1 | 3/2010 | Ruckerbauer et al. |
| 2010/0082890 | A1 | 4/2010 | Heo et al. |
| 2011/0049694 | A1 | 3/2011 | Chandrasekaran et al. |
| 2011/0082971 | A1 | 4/2011 | Berke et al. |
| 2012/0265929 | A1 | 10/2012 | Norman et al. |
| 2012/0303878 | A1 | 11/2012 | Haas et al. |
| 2014/0011300 | A1* | 1/2014 | Kim ....................... H01L 22/22 438/4 |
| 2015/0364214 | A1 | 12/2015 | Li |

FOREIGN PATENT DOCUMENTS

| | | |
|---|---|---|
| CN | 102867821 A | 1/2013 |
| TW | 200612430 A | 4/2006 |
| TW | I254937 B | 5/2006 |
| TW | I317550 B | 11/2009 |

OTHER PUBLICATIONS

Office Action dated Oct. 19, 2016 in Taiwan Application No. 103101483, 7 pages.

* cited by examiner

A = Active
S= Standby/Disabled

| Module | Configuration | State | SIGNAL_A1 | SIGNAL_C1 | SIGNAL_M1 | SIGNAL_D1 | 106a | 106b | 106c | 106d | 106e | 106f | 106g | 106h |
|---|---|---|---|---|---|---|---|---|---|---|---|---|---|---|
| Operable | 107a | 0 | 1 | 1 | 1 | 00 | S | S | S | S | S | S | S | S |
| Operable | 107a | 0 | 1 | 1 | 1 | 01 | A | A | S | S | S | S | S | S |
| Operable | 107a | 0 | 1 | 1 | 1 | 10 | S | S | A | A | S | S | S | S |
| Operable | 107b | 0 | 0 | 0 | 0 | 00 | S | S | S | S | S | S | S | S |
| Operable | 107b | 0 | 0 | 0 | 0 | 01 | S | S | S | S | A | A | S | S |
| Operable | 107b | 0 | 0 | 0 | 0 | 10 | S | S | S | S | S | S | A | A |

*FIG. 3B*

A = Active
S= Standby/Disabled

| Module | Configuration | State | SIGNAL_A1 | SIGNAL_C1 | SIGNAL_M1 | SIGNAL_D1 | 106a | 106b | 106c | 106d | 106e | 106f | 106g | 106h |
|---|---|---|---|---|---|---|---|---|---|---|---|---|---|---|
| Disabled | 107a | 1 | 1 | 0 | 1 | 00 | S | S | S | S | S | S | S | S |
| Disabled | 107a | 1 | 1 | 0 | 1 | 01 | S | S | S | S | S | S | S | S |
| Disabled | 107a | 1 | 1 | 0 | 1 | 10 | S | S | S | S | S | S | S | S |
| Reclaimed | 107b | 1 | 1 | 0 | 0 | 00 | S | S | S | S | S | S | S | S |
| Reclaimed | 107b | 1 | 1 | 0 | 0 | 01 | S | S | S | S | A | A | S | S |
| Reclaimed | 107b | 1 | 1 | 0 | 0 | 10 | S | S | S | S | S | S | A | A |

*FIG. 3C*

A = Active
S= Standby/Disabled

| Module | Configuration | State | SIGNAL_A1 | SIGNAL_C1 | SIGNAL_M1 | SIGNAL_D1 | 106a | 106b | 106c | 106d | 106e | 106f | 106g | 106h |
|---|---|---|---|---|---|---|---|---|---|---|---|---|---|---|
| Reclaimed | 107a | 0 | 1 | 1 | 1 | 00 | S | S | S | S | S | S | S | S |
| Reclaimed | 107a | 0 | 1 | 1 | 1 | 01 | A | A | S | S | S | S | S | S |
| Reclaimed | 107a | 0 | 1 | 1 | 1 | 10 | S | S | A | A | S | S | S | S |
| Disabled | 107b | 0 | 1 | 1 | 0 | 00 | S | S | S | S | S | S | S | S |
| Disabled | 107b | 0 | 1 | 1 | 0 | 01 | S | S | S | S | S | S | S | S |
| Disabled | 107b | 0 | 1 | 1 | 0 | 10 | S | S | S | S | S | S | S | S |

RECLAIMABLE SEMICONDUCTOR DEVICE PACKAGE AND ASSOCIATED SYSTEMS AND METHODS

CROSS-REFERENCE TO RELATED APPLICATIONS

The present application is a divisional of U.S. patent application Ser. No. 14/760,615, filed Jul. 13, 2015, which claims priority to International Application No. PCT/CN2013/000031, filed Jan. 15, 2013, and titled "RECLAIMABLE SEMICONDUCTOR DEVICE PACKAGE AND ASSOCIATED SYSTEMS AND METHODS," both of which are incorporated herein by reference in their entirety.

TECHNICAL FIELD

The present disclosure is related to the reclamation of semiconductor device packages. In particular, the present disclosure is related to disabling semiconductor devices or dies in a semiconductor device package that are inoperable or that underperform.

BACKGROUND

Semiconductor device technology uses electrical devices, e.g., transistors, resistors, capacitors, etc., to formulate vast arrays of functional circuits. In the manufacture of semiconductor device packages, one or more semiconductor dies are incorporated into a sealed package. Typical package styles include dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP) and interdigitated leadframes (IDF). Some semiconductor device packages include an interposer substrate, such as a circuit board, that is connected to the semiconductor dies prior to encapsulation.

Manufacturers are under constant pressure to reduce the size of semiconductor device packages and to increase the packaging density. One conventional way to increase packaging density is to increase the number of semiconductor dies in a semiconductor device package. For example, in memory device packages, such as flash memory, dynamic random access memory (DRAM), or static random access memory (SRAM), a package can include two or more dies that are stacked on top of one another and/or aligned with one another side-by-side. Such configurations provide a memory storage capacity that is based on the aggregated storage capacity of the individual dies. A 16 GB memory can include, for example, four dies each having 4 GB of memory capacity or two dies have 8 GB of memory capacity. As another example, a 64 GB memory can include 16 dies each having 4 GB of memory, eight dies each having 8 GB of memory, or four dies each having 16 GB of memory.

One drawback to this packaging technique, however, is that individual dies can be damaged or rendered inoperable during the assembly process of the package. Thermal and mechanical stresses can strain, crack, or delaminate portions of the individual dies. The molding process can damage or disconnect interior interconnects (e.g., wire bonds). Also, a die may simply underperform after it is packaged. In these instances, the semiconductor device package is rendered inoperable, even if other dies in the package remain operable.

As the number of dies in a package increases, the likelihood of the package having a damaged or inoperable die likewise increases. For example, if there is a 97% likelihood that a single die in the package will yield, the likelihood that two dies will yield is approximately 94% (i.e., $97\%^2$). In packages that incorporate four or eight dies, for example, the likelihood is reduced to 88.5% and 78.4%, respectively.

BRIEF DESCRIPTION OF THE DRAWINGS

FIGS. 3B-3D are truth tables corresponding to logic states of the memory architecture of FIG. 3A.

Figures 6C, 6D:
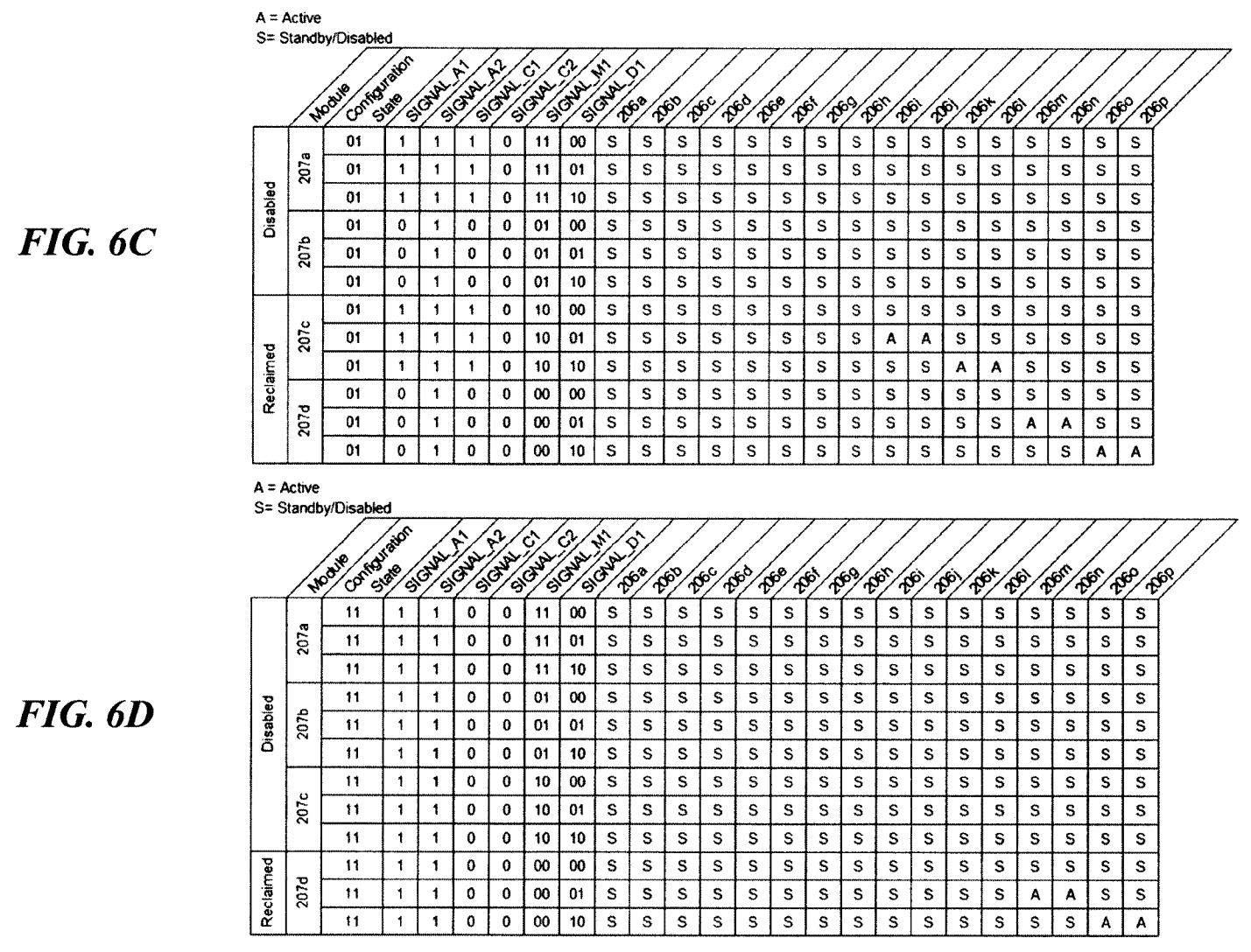

FIG. 6A is a schematic view of another memory architecture in accordance with the new technology.

FIGS. 6B-6D are truth tables corresponding to logic states of the memory architecture of FIG. 6A.

DETAILED DESCRIPTION

Specific details of several embodiments of methods for reclaiming semiconductor device packages are described herein along with related methods, devices, and systems. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies. Further, although semiconductor devices are described herein in the context of memory devices, embodiments of the new technology are not so limited. Other semiconductor devices can include controller devices, logic devices, and microprocessors, among others. Semiconductor devices can also include discrete semiconductor components, including transistors, diodes, and capacitors, to name a few.

The term "semiconductor device package" can refer to an arrangement of semiconductor devices that is incorporated into a common package. A semiconductor package can include a housing or casing that partially or completely encapsulates the assembly of semiconductor devices. A semiconductor device package can also include an interposer substrate that carries one or more semiconductor devices and that is attached to or otherwise incorporated into the package. The term "semiconductor device assembly" can refer to an assembly of one or more semiconductor devices, semiconductor device packages, and/or substrates (e.g., interposer, support, or other suitable substrates). A person skilled in the relevant art will also understand that the new technology may have additional embodiments and that the technology may be practiced without several of the details of the embodiments described below with reference to FIGS. 1-6D.

Figure 1:
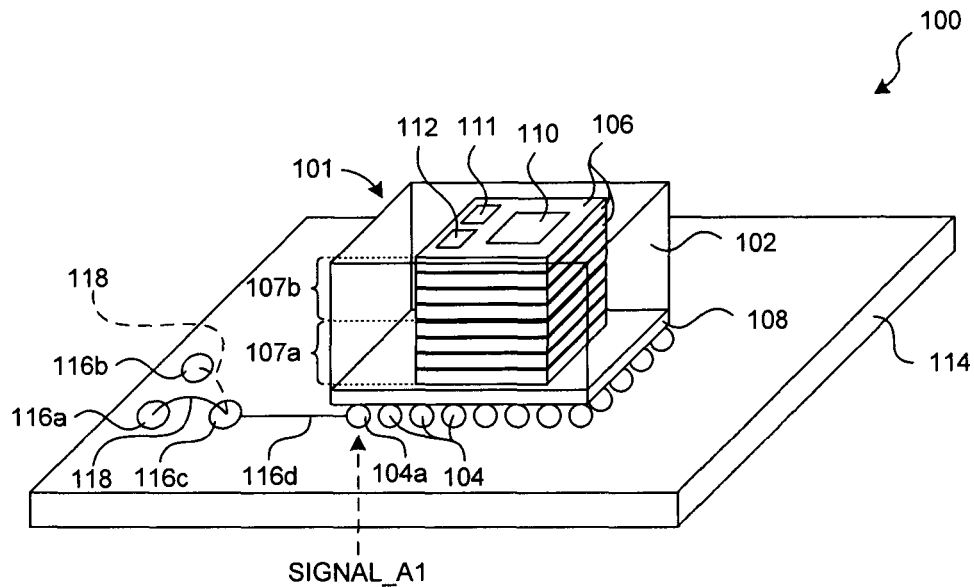
FIG. 1 is an isometric view of semiconductor device assembly in accordance with the new technology.

FIG. 1 show a semiconductor device assembly 100 in accordance with new technology. The device assembly 100 includes a semiconductor device package 101 having a package housing 102, a plurality of package contacts 104 (e.g., solder bumps or other suitable interconnects) and first and second modules 107a and 107b of semiconductor dies 106. The package contacts 104 are electrically coupled to the individual semiconductor dies 106 of the through an interposer substrate 108. The interposer substrate 108 can include conductive interconnects and signal lines or traces (not shown) that electrically connect the package contacts 104 to the individual semiconductor dies 106 through bond wires, bump bonds, and/or other contact materials (not shown) within the package housing 102.

The package housing 102 houses or encapsulates the semiconductor dies 106 with any of variety of materials, such as molded plastics, ceramics, or other suitable materials. As shown, the interposer substrate 108 is arranged to carry the package housing 102 and the semiconductor dies 106. However, the package housing 102 can have other configurations, including configurations that omit the interposer substrate 108 or that employ other types of package contacts 104, such as wire bonds or other suitable conductive structures. Further, in other embodiments, the semiconductor dies 106 can be arranged differently. As shown, the semiconductor dies 106 are stacked on top of one another; however, in some embodiments, semiconductor dies can be arranged side-by-side or arranged in stacks that are side-by-side. Further, while described below in the context of semiconductor device packages containing memory dies, the device packages can include additional or alternative types of dies or devices, such as controllers, processors, logic, or other suitable components.

As shown, each of the individual semiconductor dies 106 include an arrangement of circuit components that include a memory component 110, a configuration component 111, and a logic component 112. The memory component 110 can include any of a variety of types of memory. For example, the memory component 110 can include DRAM, SRAM, or flash memory. Also, the memory component 110 can include any of variety of memory configurations, including NOR, NAND, or other suitable configurations. Alternatively, the memory component 110 can include memory that is not charge storage based, such as magnetoresitive memory.

The memory component 110 of an individual semiconductor die 106 is aggregated with the memory components of other dies in the device package 101 to form a composite memory. For example, if the memory components 110 of the eight dies 106 have a memory capacity of 4 gigabytes (GB), the composite memory would have a composite capacity of 32 GB. In other embodiments, the composite capacity can be based on individual memory components 110 having a smaller capacity (e.g., 1 GB or 2 GB) or a larger capacity (e.g., 8 GB, 16 GB, or 32 GB capacity). Further, more or fewer dies 106 can achieve a specific composite memory capacity. As will be described in further detail below, each of the memory components 110 at the semiconductor dies 106 can be addressed by a controller (not shown) and accessed, such as for reading or writing, either individually or collectively with other memory components.

The configuration component 111, in operation, stores a module configuration state (or module configuration information) that is indicative of whether a module is operable. For example, if the first module 107a contains one or more defective dies, the configuration state can indicate that the first module is inoperable. On the other hand, if the second module 107b includes one or more defective dies, the configuration state can indicate that the second module 107b is inoperable. As will be described further below, the configuration state of the configuration component 111 can be programmed during manufacturing. More specifically, the configuration state can be programmed after the semiconductor dies 106 have been packaged.

The logic component 112 enables or activates the semiconductor die 106 for operation based, at least in part, on a first signal SIGNAL_A1 received at an individual package contact 104a. The first signal SIGNAL_A1 is indicative of a reclamation states of the device package 101. More specifically, the reclamation state indicates that either both of the first and second modules 107 are 107b are operable or that only one of the first and second modules 107a and 107b is inoperable. The reclamation state, however, does not indicate which of the first and second modules 107a and 107b is inoperable. Rather, the configuration state stored at the configuration component 111 of the dies 106 indicates which of the first and second modules 107a and 107b (if any) is inoperable.

As shown in FIG. 1, the package contact 104a is arranged to receive the first signal SIGNAL_A1; however, the first signal can be received from any one of the package contacts 104. Also, while described herein as a logic signal, the first signal SIGNAL_A1 can also include other types of information. Further, the first signal SIGNAL_A1 can also provide a voltage (e.g., power) and/or ground signal for powering and/or providing other functions at the individual dies 106.

A support substrate 114 is arranged to carry the semiconductor device package 101 and to provide electrical connections to the package contacts 104 through conductive features 116 (identified individually as first through third contacts pads 116a-c and signal line 116d). The conductive feature can include any of a variety of conductive structures, including signal lines, traces, contacts, or vias, to name few. In some embodiments, the conductive features or a portion of the conductive features can be routed through an interior section of the support substrate 114. For example, vias and conductive traces can be routed through dielectric materials of the support substrate 114. Although omitted for purposes of clarity, the conductive features 116 can be coupled to other signal lines, vias, or other features or structures at the support substrate 114. Further, the support substrate 114 can includes additional features and other components (e.g., resistors, capacitors, device packages, or other components).

As illustrated, a conductive jumper 118 can selectively couple the first and second contact pads 116a and 116b with the third contact pad 116c. The conductive jumper 118 can include a signal wire, a solder connection, or other suitable structure. In a first configuration (where the conductive jumper 118 is drawn in solid), the jumper 118 is bonded to the first contact pad 116a and the third contact pad 116c. In this configuration, the conductive jumper 118 completes an electrical connection between the first contact pad 116a and the third contact pad 116c coupled to the individual package contact 104 the signal line 116d and a contact pad (not shown) beneath the individual contact pad 104a. In a second configuration (where the conductive jumper 118 is drawn in phantom), the jumper 118 is bonded to the second contact pad 116b and the third contact pad 116c. In this configuration, the conductive jumper completes an electrical coupling between the second contact pad 116b and the individual package contact 104a.

The first contact pad 116a can provide a signal with different signal levels (i.e., voltage or current levels) during operation. Accordingly, when the conductive jumper 118 connects the first and third contact pads 116a and 116c, the first signal SIGNAL_A1 has different signal levels at the package contact 104a. For example, the first signal SIG- NAL_A1 can have different logic levels during operation (e.g., a logic "0" or logic "1").

The second contact pad 116b can provide a signal with generally the same signal level during operation. Thus, when the conductive jumper 118 connects the second and third contact pads 116b and 116c, the first signal SIGNAL_A1 at the package contact 104a has generally the same signal level. For example, the first signal SIGNAL_A1 can have a generally constant low logical level or a generally constant high logic level. This constant signal level of the first signal SIGNAL_A1 can indicate that one of the first and second modules 107a and 107b is inoperable.

In accordance with the new technology, the semiconductor device package 101 can be reclaimed based on the information of the first signal SIGNAL_A1 (i.e., the reclamation state) in combination with configuration state stored at the configuration component 111 of the individual dies 106. When the package is reclaimed, all of the semiconductor dies 106 remain in the package 101, but the package is configured to operate without the damaged modules. For example, a memory device that ordinarily operates with a 128 GB memory capacity can be reclaimed by disabling the inoperable modules and operating at a lower memory capacity, such as a 64 GB capacity or a 32 GB capacity.

Also, embodiments of the new technology simplify manufacturing. In particular, because the configuration state is stored internal to a device package, fewer jumper connections are required compared to the number of jumpers that would ordinarily be required using conventional assembly techniques. For example, conventional assembly techniques require a different placement of jumper connections for each distinct package configuration. These connections can complicate manufacturing, especially if there is a large number of available package configurations. This increases production time and the likelihood of operator or manufacturing error, which reduces overall throughput. By way of comparison, the support substrate 114 of FIG. 1 only requires three contact pads 116a-c for jumper connections. A conventional package having the same number of modules would typically require four or more contact pads for jumper connections (e.g., three contact pads arranged to provide an alternating logic signal, a logic signal at logic high, and a logic signal at logic low).

Figure 2:
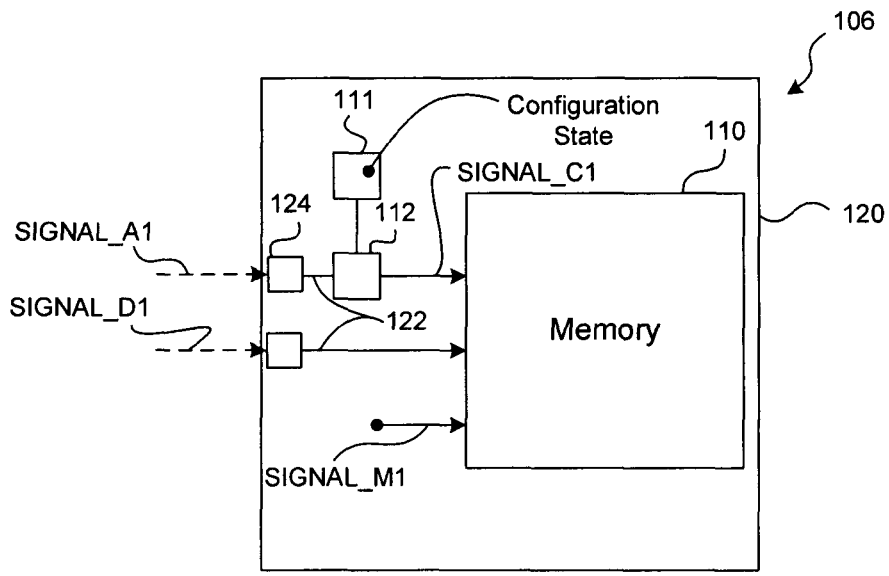
FIG. 2 is a schematic top view of a semiconductor device of the device assembly of claim 1 in accordance with the new technology.

FIG. 2 is a top plan view of the semiconductor die 106 of the semiconductor device package 101 of FIG. 1. The semiconductor die 106 includes a semiconductor substrate 120, a signal line 122 (e.g., a conductive trace), a contact or bond pad 124 coupled to the signal line 122, the memory component 110, the configuration component 111, and the logic component 122. Again, for purposes of clarity, other signal lines, components, contact or bond pads, and other features of the semiconductor die 106 have been omitted from FIG. 2. However, semiconductor die can include other signal lines, components, contact pads, and other features depending on device configuration. Further, individual circuit components can be combined as a single component. For example, a single component or fewer components can provide the separate functions of the memory component 110, the configuration component 111, and/or the logic component 112.

The contact pad 124 can be coupled to a wire bond (not shown) or other suitable interconnects for receiving signals from the support substrate 114 of FIG. 1. In particular, the contact pad 124 can receive the first signal SIGNAL_A1 from the individual package contact 104a (FIG. 1).

As discussed above, the configuration component 111 stores the module configuration state of a device package. The configuration component 111 can include, for example, one or more passive or active elements that store data or information, such as an electronic fuse, a charge storage device, or other suitable device for indicating state information. The configuration component 111 is programmable for identifying the configuration state of the module. For example, an operator and/or automatic or semi-automatic package testing tool may program the configuration component 111 after package assembly. A package testing process can identify whether the semiconductor die 106 is operable or inoperable and program the appropriate configuration state. In some embodiments, the configuration state is permanently programmed so that it cannot be changed by a customer or consumer purchaser of the semiconductor device assembly 100 or the semiconductor device package 101 (FIG. 1). For example, the configuration state may be programmed via a propriety programming signal.

The logic component 112 receives the first signal SIGNAL_A1 and provides a second signal (SIGNAL_A2) based on the configuration state of the configuration component 111 and the reclamation state of the first signal SIGNAL_A1. The second signal SIGNAL_A2 can be provided to the memory component 110 and/or another portion of the semiconductor die 106 to disable the memory component 110 or the die itself. The logic component can change the state of the SIGNAL_A1 using, for example, an inverter, one or more logic gates, or other suitable circuit components.

The circuit components at the semiconductor die 106 can also receive other signals. A die select signal SIGNAL_D1 can access or address the semiconductor die 106 or the memory component 110 at the die. For example, the die select signal SIGNAL_D1 can be encoded into addressing scheme. As described below with reference to FIGS. 3A-3D, the die select SIGNAL_D1 can be employed to identify a die that is serially ranged with another die.

A module select signal SIGNAL M1 can address and access a particular module of semiconductor dies. For example, the module select signal SIGNAL_M1 can identify a particular module, while the die select signal SIGNAL_D1 can access a particular die within the accessed module. In some embodiments, the module select signal SIGNAL_M1 can be a permanent logic low or logic high at the die 106. The permanent logic level can indicate that the die is located in a particular module. The die can be accessed based on a comparison of the second signal SIGNAL_A2 with the module select signal SIGNAL_M1 carried out at the die 106.

Figure 3A:
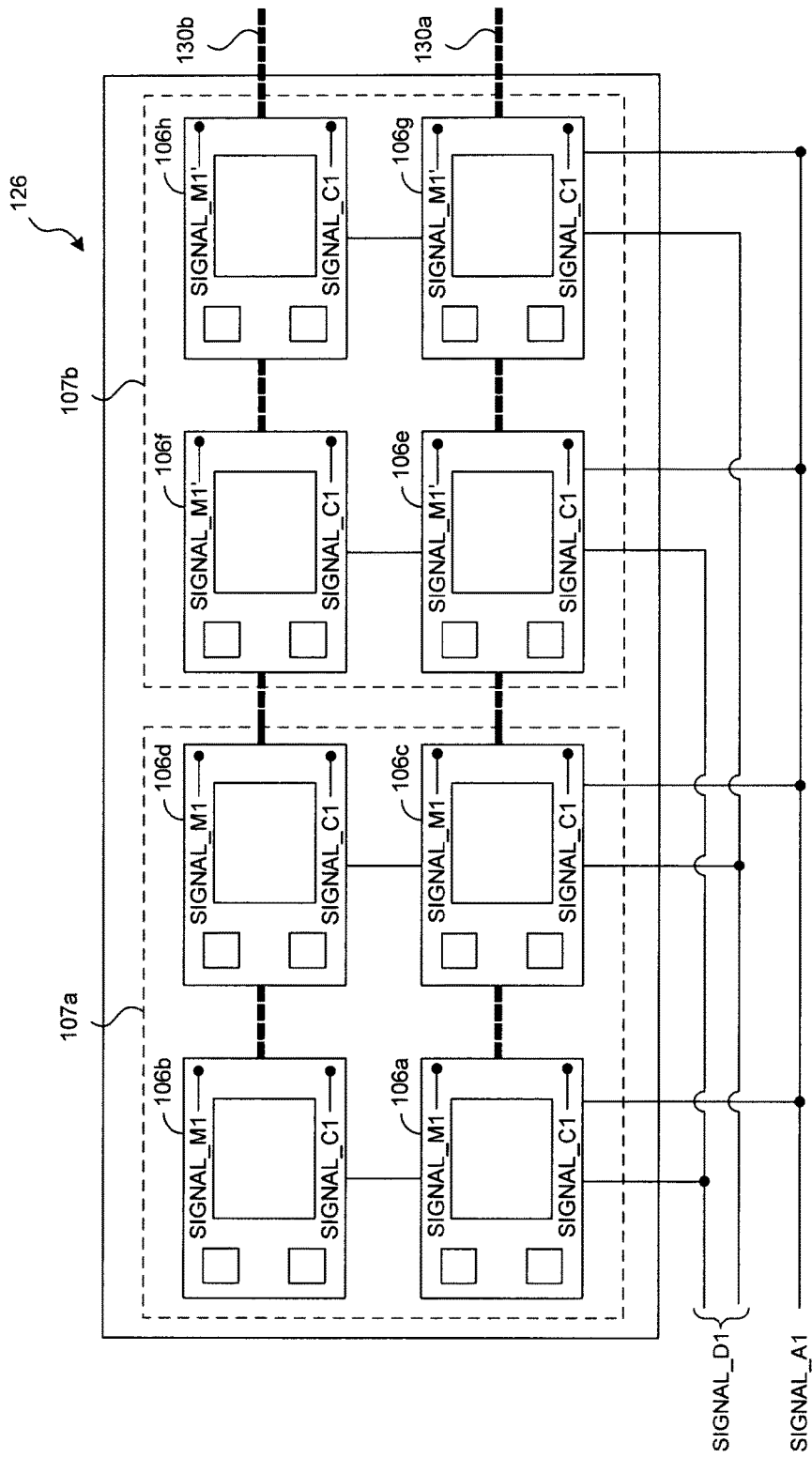
FIG. 3A is a schematic view of a memory architecture in accordance with the new technology.

FIG. 3A is a schematic illustration of a memory architecture 126 that can be employed by the semiconductor device package 101. The memory architecture includes the first module 107a of the semiconductor dies 106 (identified individually as first through fourth semiconductor dies 106a-106d) and the second module 107b of the semiconductor dies 106 (identified individually as fifth through eighth semiconductor dies 106e-106h). In the first module 107a, the first and second dies 106a and 106b are arranged in series and the third and fourth dies 106c and 106d are arranged in series. In the second module 107b, the fifth and sixth dies 106e and 106f are arranged in series and the seventh and eight dies 106g and 106h are arranged in series. The first and second modules 107a and 107b are arranged to receive the die select SIGNAL_D1, the module select signal SIGNAL_M1, and the first signal SIGNAL_A1. When activated, the individual dies 106 can be read from or written to via read/write lines 130a and 130b.

FIGS. 3B-3D are logic tables showing logic states that activate the semiconductor dies 106a-106h based on the configuration state of the individual dies 106 and the logic levels of the die select signal_D1, the module select signal_M1, and the first and second signals SIGNAL_A1 and SIGNAL_A2. More specifically, FIG. 3B shows a logic state where both the first and second modules 107a and 107b are operable; FIG. 3C shows a logic state where the first module 107a is disabled and the second module 107b can be reclaimed; and FIG. 3D shows a logic state where the second module 107b is disabled and the first module 107a can be reclaimed. Although specific binary logic levels are shown in FIGS. 3B-3D, other embodiments can include various configurations and combinations of logic signals or other suitable signals different than those shown in FIGS. 3B-3E.

FIG. 3B shows the device state of the semiconductor dies 106a-106h (i.e., active or standby/disabled) when both the first and second modules 107a and 107b are operable. In this configuration, the conductive jumper 118 can be coupled between the first and third contacts 116a and 116c (FIG. 1). As such, the first signal SIGNAL_A1 alternates between logic levels "1" and "0." Likewise, the second signal SIGNAL_A2 alternates between the same logic levels as the first signal SIGNAL_A1. As shown, the configuration state of each of the dies 106a-h is at a logic "0". Accordingly, the device state of each of the dies 106 is indicated to be active for the appropriate logical combination of the configuration state of an individual die 106, the second signal SIGNAL_A2, the module select signal SIGNAL_M1, and the die select signal SIGNAL_D1.

FIG. 3C shows the device state of the semiconductor dies 106a-106h when one or more of the dies 106 of the first module 107a are inoperable. In this configuration, the conductive jumper 118 can be coupled between the second and third contacts 116b and 116c (FIG. 1). As such, the first signal SIGNAL_A1 remains at a constant logic level "1". Also, the configuration state of each of the dies 106 is programmed to a logic level "1". Accordingly, the second signal SIGNAL_A2 at each of the dies 106 is at a logic level "1" (the inverse of first SIGNAL_A1), and the first module 107a is disabled based on the logical combination of the second signal SIGNAL_A2 and the module select signal SIGNAL_M1, such as by a logical AND or logical NAND operation carried out at each of the semiconductor dies 106. The dies 106 of the second module 107b, however, remain operable and thus the second module 107b can be reclaimed.

FIG. 3D shows the device state of the semiconductor dies 106a-106h when one or more of the dies 106 of the second module 107b is inoperable. In this configuration, and similar to the configuration of FIG. 3C, the conductive jumper 118 can be coupled between the second and third contacts 116b and 116c (FIG. 1). The first signal SIGNAL_A1 remains at logic level "1". Also, the configuration state of each of the dies 106 is programmed to a logic level "0". Accordingly, the second signal SIGNAL_A2 at each of the dies 106 is at a logic level "0" (the first SIGNAL_A1 is not inverted), and the second module 107b is disabled based on the logical combination of the second signal SIGNAL_A2 and the module select signal SIGNAL_M1. The dies 106 of the first module 107a, however, remain operable and thus the first module 107a can be reclaimed.

Figure 4:
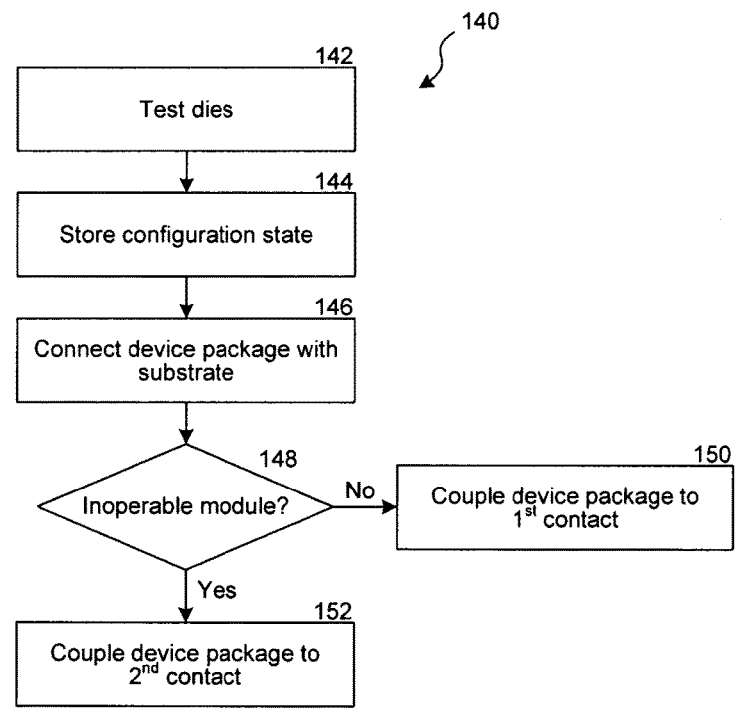
FIG. 4 is a flow diagram of a method for reclaiming a semiconductor device package in accordance with the new technology.

FIG. 4 is a flow diagram illustrating a method 140 for reclaiming a semiconductor device package. At block 142, the semiconductor dies of the device package are electrically tested to identify dies that are inoperable or that operate below a yield threshold. Device testing can be carried out at a test station that runs a testing procedure at each of the semiconductor dies of the in the package. Alternatively, the test station may test a module until at least one die is detected to be inoperable, and then move on to test a another module without testing the remaining dies of the defective module. If testing indicates all of the modules contain an inoperable die, the device package might not be reclaimable.

At block 144, a module configuration state is stored at each of the semiconductor dies (or at least at each of the operable dies) 106. The stored configuration indicates which module is configured for operation. For example, as shown in FIG. 3C, a logic level "1" can be stored at each of the dies 106 to indicate that the first module 107a is to be disabled. Alternatively, a logic level "0" can be stored at each of the dies 106 in the device package to indicated that the second module 107b is to be disabled. The test station, for example, can program the configuration state at the dies 106.

At block 146, the semiconductor device package 101 is attached and electrically coupled to a support substrate. At decision block 148, a conductive jumper is coupled to one of two locations on the support substrate depending on whether the semiconductor device includes an inoperable module. If all of the dies are operable, the jumper couples a package contact to a first location, e.g., a contact pad or other conductive feature, on the support substrate (block 150). However, if the semiconductor device package contains an inoperable die in one of the modules, the jumper couples the package contact to a second location on the support substrate (block 152). As discussed above, the jumper connection with the second location is made regardless of which module is inoperable.

Figure 5:
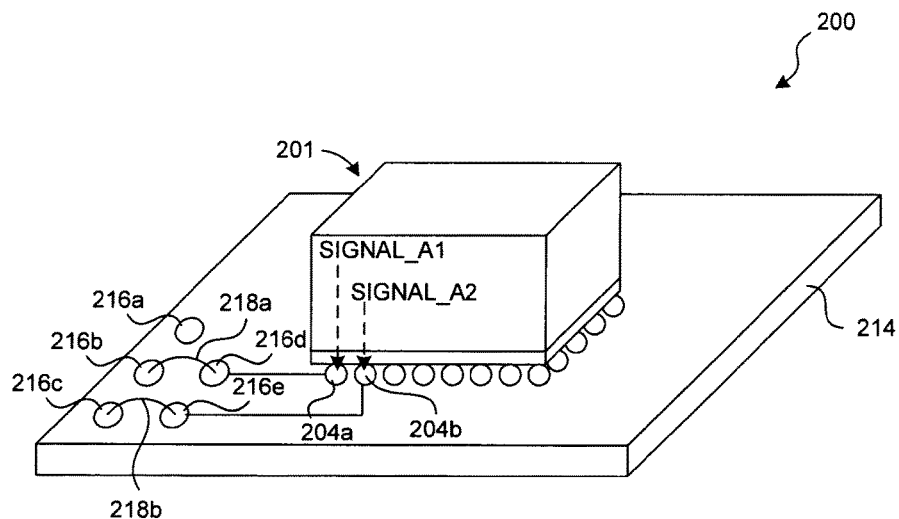
FIG. 5 is an isometric view of semiconductor device assembly in accordance with the new technology.
Figures 6A, 6B:
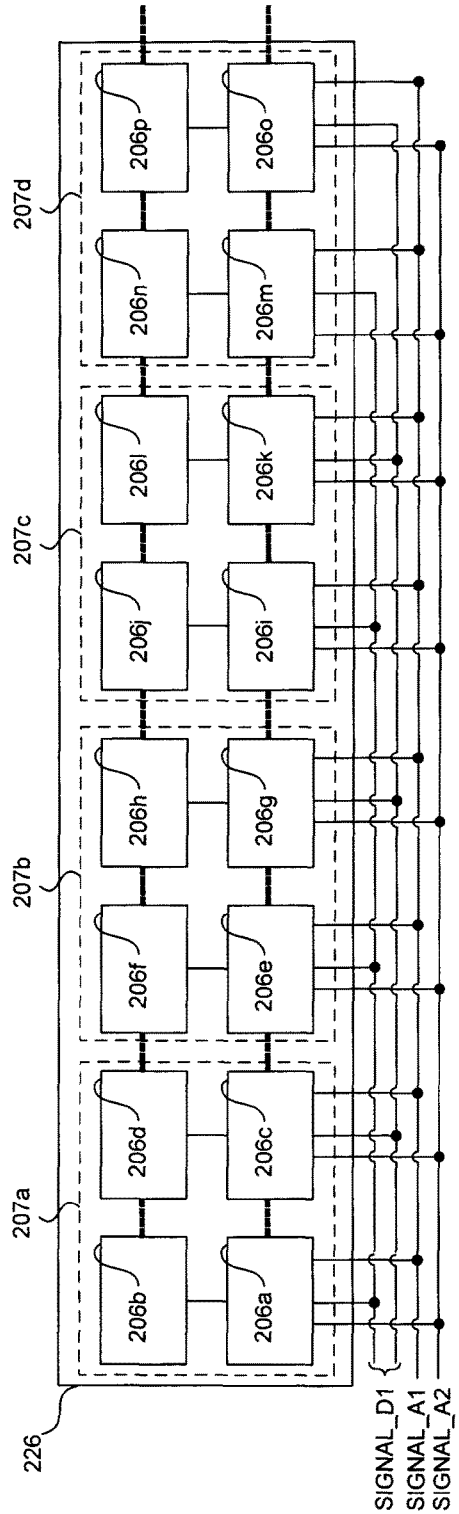

In some embodiments, a semiconductor device package includes more than two modules of semiconductor dies. FIG. 5 shows a semiconductor device assembly 200 including a device package 201 having four modules (not shown) and a support substrate 214 with contact pads 216 (identified individually as first through fifth contact pads 216a-f). A first package contact 204a is arranged to receive the first signal SIGNAL_A1 and a second package contact 204b is arranged to receive a third signal SIGNAL_A3 that is also indicative of the reclamation state. For example, the first and third signals SIGNAL_A1 and SIGNAL_A2 can provide two data bits of information regarding the reclamation state.

As shown, the first signal_A1 can be provided by a first conductive jumper 218a and the third signal SIGNAL_A3 can be provided by a second conductive jumper 218b. The first conductive jumper 218a can be selectively coupled to the first contact pad 216a (providing a signal that alternates between high and low logic levels) and the second contact pad 216b (providing a generally constant logic level). The second conductive jumper 218b can be selectively coupled to the fourth contact pad 216d (providing a signal that alternates between high and low logic levels).

FIG. 5A shows a memory architecture 226 that can be employed in the semiconductor device package 201. The architecture 226 includes four modules 207 (identified individual as first through fourth modules 207a-207d). FIGS. 5B-E show logic tables corresponding to several reclamation and configuration states of the memory architecture 226. Referring first to FIG. 5A, the semiconductor dies 206 (identified individually as first through sixteenth modules 206a-p) are configured to store a module configuration state with four different available logic states. The third signal Signal_A3 can be inverted to provide a fourth Signal_A4 (see FIGS. 5B-E) based on the configuration state stored at the dies 206.

FIGS. 5B-5D are logic tables showing logic states that activate the semiconductor dies 206a-206p based on the configuration state of the individual dies 206 and the logic levels of the die select signal_D1, the module select signal SIGNAL_M1, and the first through fourth signals SIG- NAL_A1-SIGNAL_A4. FIG. 5B shows the logic states when all of the dies 206 are operable. FIG. 5C shows the logic states when only the third and fourth modules 207c and 207d are operable. FIG. 5D shows the logic states when only the fourth module 207d is operable. Although not shown, other logic states can disable any of the first through fourth modules 207a through 207d individually or collectively with other modules.

Although described herein in the context of packaged semiconductor devices having two modules (FIGS. 1-3D) or four modules (FIGS. 5-6D), a skilled artisan will appreciate that embodiments of the new technology can include device packages with a different number of modules. For example, a device package could include an odd number of modules (e.g., three modules) or a larger number of modules, such as eight modules or sixteen modules. These device packages, similar to the device packages containing two or four modules, would require a limited number of jumper connections.

In addition, in some embodiments, the reclamation state can also be stored at a circuit component of one or more individual semiconductor die. Additionally or alternatively, the configuration state could include reclamation information. In either of these cases, the device package would require fewer jumper connections or no jumper connections at all.

From the foregoing, it will be appreciated that specific embodiments of the invention have been described herein for purposes of illustration, but well-known structures and functions have not been shown or described in detail to avoid unnecessarily obscuring the description of the embodiments of the invention. Reference terms such as "top," "bottom," and "side" are used for purposes of explanation and refer primarily to certain perspectives shown in the Figures, and are not limiting. The structures and components described herein may have a different orientation in operation than that shown in a Figure. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding; rather, the invention includes any and all other embodiments defined by the claims.

I claim:

1. A method of reclaiming a semiconductor device package having a plurality of semiconductor dies arranged in at least a first module of a first plurality of semiconductor dies and a second module of a second plurality of semiconductor dies, the method comprising:
   determining whether a first semiconductor die in the first module is inoperable and whether a second semiconductor die in the second module is inoperable, wherein the second semiconductor die is different from the first semiconductor die;
   storing a configuration state at a third semiconductor die in the semiconductor device package based on whether the first semiconductor die is inoperable and the second semiconductor die is inoperable, the configuration state indicative of which modules in the semiconductor device package are operable;
   coupling a package contact of the semiconductor device package with a first contact on a support substrate when none of the modules are inoperable; and
   coupling the package contact of the semiconductor device package with a second contact on the support substrate when at least one of the modules is inoperable, wherein the second contact is different from the first contact.

2. The method of claim 1, further comprising:
   determining whether first module is inoperable based on whether the first semiconductor die is inoperable and whether the second module is inoperable based on whether the second semiconductor die is inoperable;
   receiving a first signal via the first contact on the support substrate when none of the modules are inoperable; and
   receiving a second signal via the second contact on the support substrate when the at least one of the modules is inoperable, wherein the second signal is configured to disable the at least one module based on the configuration state.

3. The method of claim 1, wherein the third semiconductor die is located in the first module.

4. The method of claim 1, wherein the third semiconductor die is located in the second module.

5. The method of claim 1, wherein determining whether the first semiconductor die is inoperable comprises determining whether the first semiconductor die is operating below a yield threshold.

6. The method of claim 1, further comprising programming the configuration state at the first plurality of semiconductor dies of the first module and the second plurality of semiconductor dies of the second module.

7. The method of claim 2, wherein the first signal has different logic levels and the second signal has a single logic level.

8. The method of claim 2, further comprising:
   operating without the at least one module based on receiving the second signal and based on the configuration state stored at the third semiconductor die, wherein the at least one module includes one or more semiconductor dies that are operable.

* * * * *